United States Patent [19]
Maerkedahl

[11] Patent Number: 5,343,997
[45] Date of Patent: Sep. 6, 1994

[54] METHOD AND DEVICE FOR SUCCESSIVELY FEEDING OF COMPONENTS TO A MOUNTING APPARATUS

[76] Inventor: Henning Maerkedahl, Roersangervej 31, DK-8382 Hinnerup, Denmark

[21] Appl. No.: 972,833

[22] Filed: Nov. 6, 1992

[30] Foreign Application Priority Data

Nov. 12, 1991 [DK] Denmark ............................ 1857/91

[51] Int. Cl.[5] ............................................ B65G 29/00
[52] U.S. Cl. ..................................... 198/392; 198/380
[58] Field of Search ........................ 198/392, 380, 397; 221/164, 171

[56] References Cited
U.S. PATENT DOCUMENTS

| | | | |
|---|---|---|---|
| 2,765,900 | 10/1956 | Seabrooke | 198/380 |
| 3,012,651 | 12/1961 | Hawkes | 198/380 |
| 3,599,829 | 8/1971 | Aidlin | 198/380 X |
| 3,635,325 | 1/1972 | Sterling | 198/380 X |
| 3,643,783 | 2/1972 | Sterling | 198/380 |
| 3,710,920 | 1/1973 | Sterling | 198/392 X |
| 4,709,798 | 12/1987 | Herzog | 198/392 X |
| 4,884,678 | 12/1989 | Graham et al. | 198/392 |
| 4,995,503 | 2/1991 | Graham et al. | 198/392 |
| 5,070,988 | 12/1991 | Konishi et al. | 198/380 |

*Primary Examiner*—Cheryl L. Gastineau
*Attorney, Agent, or Firm*—Antonelli, Terry, Stout & Kraus

[57] ABSTRACT

A feeding device in accordance with the invention comprises a dosing wheel driven by a drive mechanism which rotates on a horizontal axis; a plurality of carrier shelves for receiving the components and attached to an inside periphery of the dosing wheel; an opening disposed in the dosing wheel for supplying the components to the carrier shelves disposed inside the dosing wheel; an inclined sorting groove projecting partly into the dosing wheel and having a V-shaped cross section and a bottom surface having a width corresponding to a width of the components; an open groove positioned between the sorting groove and a covered feeder channel with the open groove having a width which corresponds to the width of the components and with the feeder channel having a cross section corresponding to a cross section of the components; a first air nozzle positioned in front of the feeder channel for blowing away components which are incorrectly oriented to pass into the feeder channel; a forward directed second air nozzle positioned inside the entrance of the feeder channel for blowing the components forward in the feeder channel towards a delivering position; and a delivering mechanism for lifting components in the feeder channel upwards to the delivering position.

13 Claims, 1 Drawing Sheet

U.S. Patent  Sep. 6, 1994  5,343,997
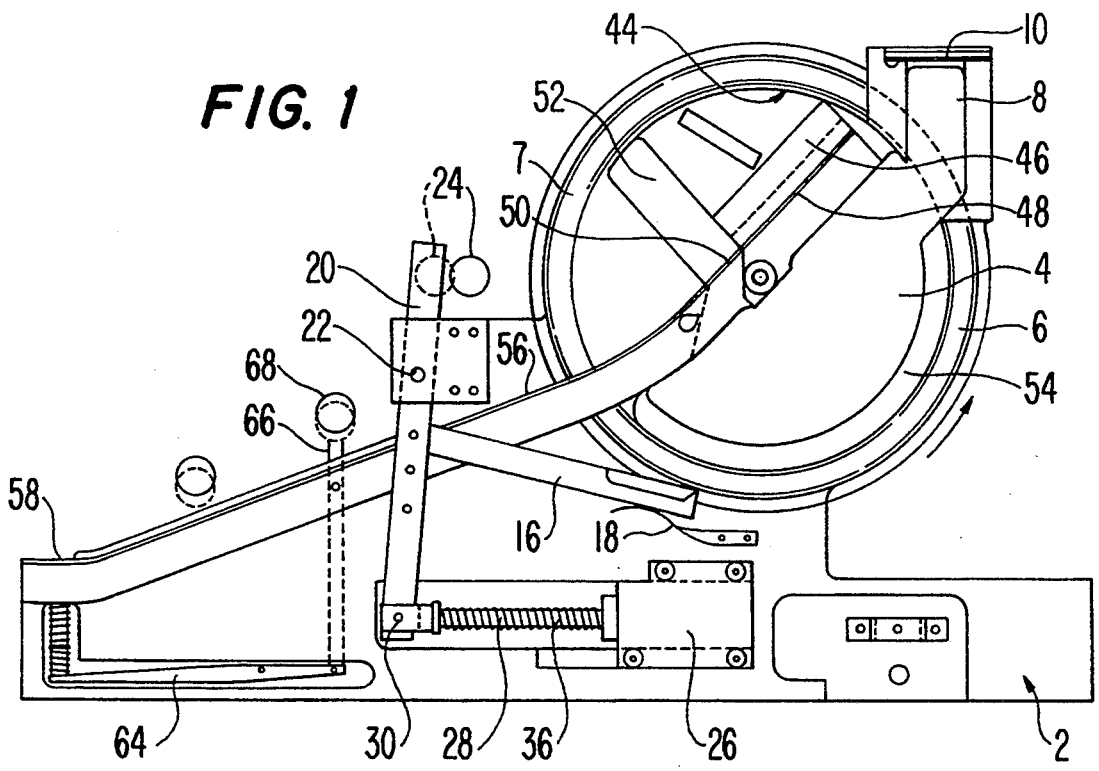
FIG. 1
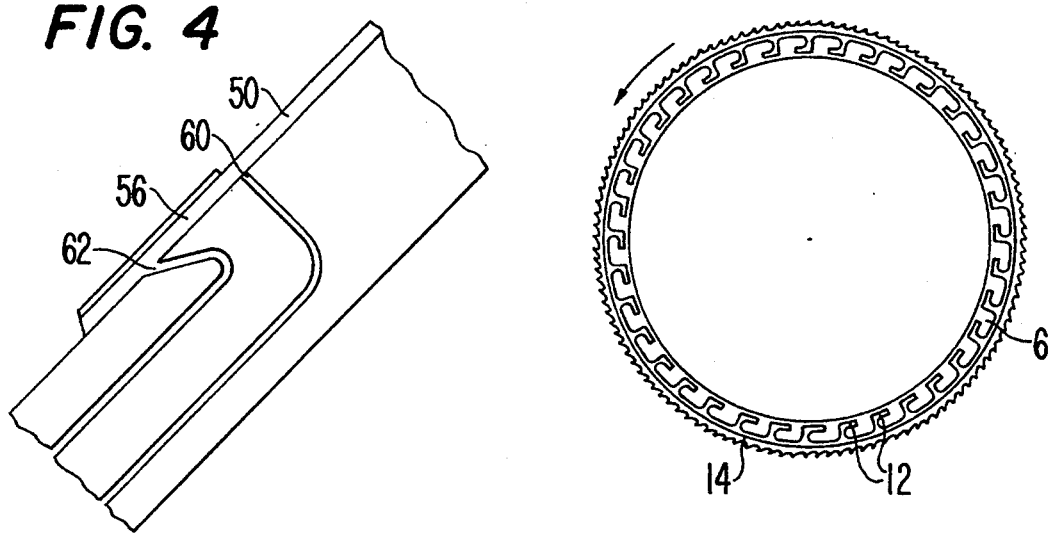
FIG. 4
FIG. 2
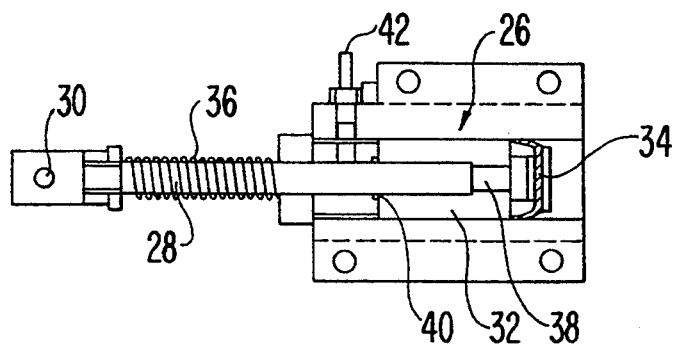
FIG. 3

METHOD AND DEVICE FOR SUCCESSIVELY FEEDING OF COMPONENTS TO A MOUNTING APPARATUS

TECHNICAL FIELD

The present invention relates to a method for successively feeding or delivering of components, particularly surface mounted devices hereinafter SMD-components, to a mounting apparatus.

BACKGROUND ART

Normally, mounting apparatuses for positioning small SMD-components on chips and small printed circuit cards are adapted to work with SMD-components, which as delivered from the factory are mounted on carrier tape in rolls. A demounting of the SMD-components from the carrier tape is carried out in connection with the mounting apparatus.

This temporary mounting of small SMD-components on carrier tape has so far been a necessity, which adds an additional price to the actual SMD-components, such as for instance physically rather small resistances, condensers, inductors, etc.

DISCLOSURE OF INVENTION

The invention provides a method, which makes it possible to use small SMD-components in bulk, that omits the use of tape mounting which increases price and eliminates the demounting of small SMD-components. This results in price reduction and simplified production and handling of small SMD-components.

The method according to the invention is distinctive in that a quantity of loose components is supplied to a narrow vertical dosing drum or dosing wheel which is rotated preferably stepwise on a horizontal axis. The components by means of carrier members disposed along the inside periphery of the dosing drum or the dosing wheel are conveyed upwards to a position, from where the components are allowed to fall down over an inclined sorting groove with a mainly V-shaped cross section and with a bottom surface, the width of which corresponds to the width of the components. The components—between the sorting groove and a feeder channel with a cross section fitting the cross section of the components are conveyed in an open groove with a width corresponding to the width of the components. The components, which are not placed with correct orientation in the open groove just in front of the entrance to the feeder channel are blown away by means of a transverse air nozzle. The components which are correctly fed into the feeder channel are conveyed by means of air being supplied via a forward directed air nozzle. The components at a delivering end of the feeder channel successively are lifted upwards to a delivering position.

In a simple manner and by utilization of the different length and width conditions of the SMD-components it becomes possible with the invention to obtain a precise orientation of some of the supplied SMD-components in the bottom of the V-shaped sorting groove so that a first sorting of components during the subsequent passage to the open groove will take place. The components are positioned across the open groove which upon final sorting out of uncorrectly orientated SMD-components made by the transverse air nozzle, permits the SMD-components with correct orientation are to move into and forward in the feeder channel.

In order to secure sufficient capacity of SMD-components to the delivering position, a surplus of SMD-components is conveyed to the elevated position so that the sorting groove, the open groove, and the feeder channel may be kept filled sufficiently with components.

By the method of the invention a common mechanism driven by a mounting apparatus is used for the rotation of the dosing drum and for the operation of the air pump device for said air nozzles.

The invention also relates to a device for use by the described method. The device is destinctive in that it comprises a narrow vertical dosing drum or a dosing wheel which by means of a drive mechanism is rotated preferably stepwise on a horizontal axis and which along the inside periphery is provided with carrier members for SMD-components supplied via a filling opening. An inclined sorting groove partly projects into the dosing drum and is provided with a mainly V-shaped cross section and a bottom surface the width of which corresponds to the width of components. An open groove is positioned between the sorting groove and a covered feeder channel having a width which also corresponds to the width of the components which feeder channel has a cross section fitting the cross section of the components. An air nozzle is positioned just in front of the feeder channel and is adapted to blow away components not correctly orientated to be fed into the feeder channel. A forward directed air nozzle is positioned inside the entrance and is adapted to blow the components forward in the feeder channel towards a delivering position and which preferably is supplied with air from a built-in air pump device. A delivering mechanism is adapted to lift foremost component in the feeder channel upwards to the delivering position.

Expediently the device according to the invention comprises a common drive mechanism in the form of a spring affected arm which is pivoting on a horizontal axis of the apparatus frame and which operates a pawl arm engaging with an external toothed rim of the dosing drum. A piston of an air pump device is adapted to preferably during the backstroke of the piston in a pump cylinder to supply air through a preferably common air tube to the air nozzles. The arm preferably is adapted to be swing by means of a moving device of the belonging mounting apparatus.

Preferably the delivering mechanism consists of a mainly horizontal lifting arm which at one end is adapted to be affected with a downwards directed movement of a vertical activation lever and which at an opposite end via a spring is connected with a thin vertical lifting piston stretching through the feeder channel in front of the delivering position. The piston is lifted foremost upwards to the delivering position. The activation lever preferably is adapted to be activated by a downwards push by a moving device of the mounting apparatus.

To obtain correct sorting and continuous delivering of SMD-components, the V-shaped sorting groove is positioned with an inclination of about 45° to the horizontal and the open groove has a corresponding inclination. The inclination of the feeder channel from the open groove and forward towards the delivering position where the feeder channel is mainly horizontal has an inclination of about 20°.

In order to get incorrectly oriented SMD-components to fall down from the open groove as far as possible, the open groove is provided with side walls, which inside are vertical and mutually parallel, and which outside have towards each other inclined upper sharp side edges.

Most advantageously the air nozzle just in front of the entrance to the feeder channel consists of a thin, transverse air nozzle. Only one component is blown away from the position just in front of the feeder channel while the forward directed air nozzle ends in a smooth bottom of the feeder channel at an angle of about 45°.

BRIEF DESCRIPTION OF THE DRAWINGS

The invention is described in the following with reference to the drawing, in which:

FIG. 1 shows a plan side view of an embodiment for a delivering device according to the invention for which the narrow dosing wheel is not shown, FIG. 2 shows a side view of an embodiment for a dosing wheel of the delivering device of FIG. 1, FIG. 3 shows an embodiment for an air pump device of the delivering device according to the invention, and FIG. 4 shows the detail of the delivering device of FIG. 1.

BEST MODE FOR CARRYING OUT THE INVENTION

The delivering device shown in FIG. 1 is constructed on a relatively narrow support plate 2 made of light-alloy metal either by machining or by moulding. The support plate 2 is provided with a partly circular sorting chamber 4 on which a dosing wheel 6 (FIG. 2) is mounted in such a manner, that the dosing wheel 6 is rotating closely along a surrounding flange 7. The sorting chamber 4 is provided with an upper filling opening 8 with a connection socket 10 for a container (not illustrated) with loose SMD-components, which via the filling opening 8 may be emptied into the dosing chamber 4 which is surrounded by the dosing wheel 6. This dosing wheel has a width (perpendicular to the plan of the paper of FIG. 2) of about 5 mm and is closed behind by a circular cover plate (not shown).

Along the inside periphery the dosing wheel 6 there are provided a large number of carrier members in the form of projecting L-shaped shelves 12 and along the outside periphery the dosing wheel 6 there is provided a toothed rim 14 used for providing a step-by-step rotation of the dosing wheel 6 by means of a pawl arm 16 which by means of a spring 18 is spring biased inwards the toothed rim 14. The pawl arm 16 is driven by a swing arm 20 mounted in the support plate 2 on a horizontal pivot 22. The swing arm 20 is operated by an activation lever 24 associated with a mounting apparatus in connection with which the delivering device may be used.

The swing arm 20 also drives an air pump device 26. The lower end part of the swing arm 20 is connected with an outer end of a piston rod 28 at point 30. The opposite end of the piston rod 28 cooperates with a pump cylinder 32 with a pump piston 34 (FIG. 3). Outside the air pump device 26 the piston rod 28 is surrounded by a pressure spring 36 providing for the returning of the swing arm 20, the pawl arm 16 and for the proper stroke of the pump. Because the air pump device 26 is constructed as a reversed cycle pump, where the compressed air is discharged from the pump cylinder when narrowing 38 of the piston rod 28 is passing through a tightening ring 40 to cause the compressed air almost momentarily to be let out through a side channel 42 to a tube (not shown), which as described below is feeding the air to the feeder device.

The function of the feeder device is as follows: A supply of very small SMD-components, for instance resistant capacitors, inductors or the like, are emptied via the filling opening 8 in the dosing chamber 4. By moving the swing arm 20 towards the left by means of the lever 24 of the mounting apparatus, the pawl arm 16 is moved towards the right and causes turning of the dosing wheel 6 in the direction of the arrow. The L-shaped carrier shelves 12 carried by the dosing wheel cause, the SMD-components to move upwards to an elevated position 44. The SMD-components fall down from position 44 in an inclined sorting groove 46 having a V-shaped cross section, of which one flange is longer than the other and projects under the dosing wheel 6, and which has a bottom groove 48 with a smooth bottom surface and a width chosen in accordance with the width of the actual SMD-components.

From the V-shaped sorting grove 46 correctly orientated SMD-components (it shall be mentioned that the SMD-components in question have a distinct short side and a distinct long side, that is with clear difference in the width and length proportions) slide via the bottom groove 48 out into an open groove 50 having side walls. The height of the open groove 50 fits the thickness of the SMD-components. The side walls also having sharp upper side edges, so that in correctly orientated SMD-components easily fall from the open groove 50 and down into the bottom of the dosing chamber 4 and the dosing wheel 6, respectively. To guide these sorted out components back to the bottom of the dosing chamber 4 opposite the open groove 50 provided with an inclined guiding surface 52 and an arched inclined guiding surface 54 is provided along the lower part of the dosing chamber 4.

From the open groove 50, which like the V-shaped sorting groove 46 extends in an angle to horizontal of about 45°, correctly orientated components are fed into the covered feeder channel 56 extending forward and downward to a horizontal delivering position 58 with an angle of inclination of about 20°. Just in front of the entrance to the covered feeder channel 56, the cross section of which also is sized to the cross section of the actual SMD-components, incorrectly orientated components (that is components not being correctly placed in a row in the bottom of the open groove 50) are blown away by means of a thin transverse air nozzle 60 supplied with air from the earlier described air pump device 26.

At the same time the air pump device 26 supplies a forward directed air nozzle 62 ending in the smooth bottom surface of the covered feeder channel 56 at an angle of about 45°, so that a narrow row of components successively are blown and pushed forward towards the delivering position 58, where the foremost SMD-component is lifted up from the delivering position 58 by means of a thin vertical piston, which is operated by a horizontal arm 64, a vertical lever 66 and an operation cam 68 of the mounting apparatus.

In the delivering position 58 the SMD-components are picked up by means of a thin suction pick-up and are positioned correctly on a chip or printed circuit card as usual. Test have shown, that the delivering device according to the invention may deliver up to 10 components per second, which corresponds to more that the double the usual known number of components supplied from tape.

I claim:

1. A method for successively feeding loose components including SMD-components, to a delivery position of a mounting apparatus with the components having a distance between terminal ends which is larger than a width of the components comprising;

supplying a quantity of loose components to a dosing wheel rotating on a horizontal axis so that the components are carried by carrier shelves disposed along an inside periphery of the dosing wheel upwards to an elevated position;

causing the components to fall from the elevated position into an inclined sorting groove having a V-shaped cross section and a bottom surface having a width corresponding to a width of the components;

causing the components to slide from the sorting groove into an open groove having a width corresponding to a width of the components so that components which do not have a correct orientation in the open groove are blown away by a first air stream contacting the components not having the correct orientation;

causing the components to slide from the open channel to a feeder channel having a cross section which corresponds to a cross section of the components so that components which are correctly oriented in the feeder channel are conveyed by contact with a second air stream in a direction of movement of the components in the feeder channel; and causing delivery of the components after passage through the feeder channel to the delivery position by moving the components upward from the end of the feeder channel to the delivery position.

2. A method in accordance with claim 1 wherein:
a surplus of components is conveyed to the elevated position by the dosing wheel to cause the sorting groove, open channel and feeder channel to remain full during feeding of the loose components.

3. A method in accordance with claim 1 further comprising:
driving the dosing wheel and a pump which produces the air streams with a common drive mechanism.

4. A method in accordance with claim 1 wherein:
the dosing wheel is rotated in a step by step movement.

5. A feeding device comprising:
a dosing wheel driven by a drive mechanism, the wheel rotating on a horizontal axis;
a plurality of carrier shelves for receiving components, the shelves being attached to an inside periphery of the dosing wheel;
a filling opening disposed in the dosing wheel for supplying the components to the carrier shelves disposed inside the dosing wheel;
an inclined sorting groove projecting partly into the dosing wheel and having a V-shaped cross section and a bottom surface having a width corresponding to a width of components;
an open channel positioned between the sorting groove and a covered feeder channel with the open channel having a width which corresponds to the width of the components with the feeder channel having a cross section corresponding to a cross section of the components;
a first air nozzle positioned in front of the feeder channel for producing a first air stream contacting components not having the correct orientation for blowing away components which are not correctly orientated to pass into the feeder channel;
a second air nozzle positioned inside the entrance of the feeder channel for producing a second air stream contacting the components in the feeder channel for blowing the components forward in the feeder channel towards a delivering position; and
a delivering mechanism for lifting components in the feeder channel upward to the delivering position.

6. A feeding device in accordance with claim 5 further comprising:
a common drive mechanism for driving the dosing wheel and an air pump proving air to the air nozzles.

7. A feeding device in accordance with claim 6, wherein the common drive mechanism comprises:
a spring biased arm pivoted on a horizontal axis of an apparatus frame to which the feeding device is attached and operating a pawl arm engaging an external toothed rim of the dosing drum and a piston of the air pump.

8. A feeding device in accordance with claim 7 wherein:
the piston pumps air to an air tube supplying air to the first and second air nozzles; and
the common drive mechanism is attached to the apparatus frame, 9. A feeding device in accordance with claim 5 wherein the delivering mechanism comprises:
a horizontal lifting arm which at one end moves downward in response to directed movement of a vertical activation lever and which at an opposite end is lifted upward to cause a component to be lifted to the delivering position.

10. A feeding device in accordance with claim 5 wherein:
the sorting groove is positioned with an inclination of about 45° to horizontal, the open groove has an inclination of about 45°, and the feeder channel from the open groove and forward towards the delivering position, has an inclination of about 20°.

11. A feeding device in accordance with claim 5 wherein:
the open groove has vertical side walls which are mutually parallel.

12. A feeding device in accordance with claim 5 wherein:
the first air nozzle is a transverse air nozzle.

13. A feeding device in accordance with claim 5 wherein:
the second air nozzle ends at the smooth bottom of the feeder channel at an angle of about 45°.

* * * * *